United States Patent
Tansel et al.

(10) Patent No.: US 11,764,323 B2
(45) Date of Patent: Sep. 19, 2023

(54) SEMICONDUCTOR PHOTODIODE FUNCTIONING IN A WIDE BAND RANGE AND OBTAINING METHOD THEREOF

(71) Applicant: ORTA DOGU TEKNIK UNIVERSITESI, Ankara (TR)

(72) Inventors: Tunay Tansel, Ankara (TR); Rasit Turan, Ankara (TR)

(73) Assignee: ORTA DOGU TEKNIK UNIVERSITESI, Ankara (TR)

( * ) Notice: Subject to any disclaimer, the term of this patent is extended or adjusted under 35 U.S.C. 154(b) by 242 days.

(21) Appl. No.: 17/416,538

(22) PCT Filed: Oct. 25, 2019

(86) PCT No.: PCT/TR2019/050901
§ 371 (c)(1),
(2) Date: Jun. 21, 2021

(87) PCT Pub. No.: WO2020/130972
PCT Pub. Date: Jun. 25, 2020

(65) Prior Publication Data
US 2022/0045229 A1    Feb. 10, 2022

(51) Int. Cl.
*H01L 31/103*     (2006.01)
*H01L 31/0224*    (2006.01)
(Continued)

(52) U.S. Cl.
CPC ........ *H01L 31/103* (2013.01); *H01L 31/0288* (2013.01); *H01L 31/02363* (2013.01); *H01L 31/022408* (2013.01); *H01L 31/1804* (2013.01)

(58) Field of Classification Search
CPC ........... H01L 31/103; H01L 31/022408; H01L 31/02363; H01L 31/0288; H01L 31/1804;
(Continued)

(56) References Cited

U.S. PATENT DOCUMENTS

| 8,679,959 B2 * | 3/2014 | Carey | H01L 21/26513 |
| | | | 438/522 |
| 2013/0001553 A1 * | 1/2013 | Vineis | H01L 31/1035 |
| | | | 257/E31.13 |

(Continued)

FOREIGN PATENT DOCUMENTS

KR        20160079274 A  *  7/2016
KR           101695426 B1 *  1/2017

OTHER PUBLICATIONS

C.-H. Li et al., "Sulfur-Doped Silicon Photodiode by Ion Implantation and Femtosecond Laser Annealing," in IEEE Sensors Journal, vol. 17, No. 8, pp. 2367-2371, Apr. 15, 15, 2017, doi: 10.1109/JSEN.2017.2666178. (Year: 2017).*

*Primary Examiner* — Sitaramarao S Yechuri
(74) *Attorney, Agent, or Firm* — Bayramoglu Law Offices LLC

(57) ABSTRACT

A semiconductor photodiode which functions in a wide band range up to medium wave infrared and far wavelengths in addition to visible region and near infrared includes: a light absorber region in micro structure which can provide light absorbance upon being roughened by laser; a first electrical lower contact coated with metal materials such as aluminium (Al), silver (Ag); a silicon which consists of crystalline silicon (c-Si); a second electrical lower contact which is coated with metal materials such as aluminium (Al), silver (Ag); a chalcogen doped hyper-filled silicone region which is obtained as a result of doping by pulse laser to the silicone region implanted by chalcogen elements; and upper electrical contact parts which are coated generally in the thickness range of 10 nm-1000 nm by using two-layered alloys with aluminium (Al)—(Al)-silver (Ag), two-layered alloys with titanium (Ti)-gold (Au), three-layered alloys with Ti-Platinum(Pt)—Au—Ag or three-layered alloys with Ti-lead (Pb)—Ag.

16 Claims, 2 Drawing Sheets

(51) Int. Cl.
*H01L 31/0236* (2006.01)
*H01L 31/0288* (2006.01)
*H01L 31/18* (2006.01)

(58) Field of Classification Search
CPC ......... H01L 31/02161; H01L 31/02327; H01L 31/1037; H01L 31/1864; H01L 21/02; Y02E 10/547; Y02P 70/50
See application file for complete search history.

(56) References Cited

U.S. PATENT DOCUMENTS

2016/0111579 A1* 4/2016 Shi ..................... H01L 31/0749
257/184
2017/0345951 A1* 11/2017 Carey ............... H01L 31/02024
2017/0358694 A1* 12/2017 Juntunen ........... H01L 31/02363

* cited by examiner

SEMICONDUCTOR PHOTODIODE FUNCTIONING IN A WIDE BAND RANGE AND OBTAINING METHOD THEREOF

CROSS REFERENCE TO THE RELATED APPLICATIONS

This application is the national phase entry of International Application No. PCT/TR2019/050901, filed on Oct. 25, 2019, which is based upon and claims priority to Turkish Patent Application No. 2018/19952, filed on Dec. 20, 2018, the entire contents of which are incorporated herein by reference.

TECHNICAL FIELD

The present invention relates to a semiconductor photodiode (photodetector) which functions in a wide band range up to medium wave infrared and far wavelengths in addition to visible region and near infrared and comprises the doped state of black silicon with elements of chalcogen group (S(sulfur), Se(selenium) and Te(tellurium)); and obtaining method thereof.

BACKGROUND

A material called as black silicon (b-Si) is also a variation of silicon with useful optical and electrical features. This material contains almost all of the light reaching its surface, within itself and therefore it provides maximum benefit from the incident light. Thus, it can be said to be useful in solar energy and photodetector systems.

Today in photodetector field, mainly in quantum well infrared photodetectors (QWIP-Quantum Well Infrared Photodetector), HgCdTe (Mercury Cadmium Telluride—MCT) and Type-II super mesh detectors are commonly used. However, considering high costs of these detectors during production step, searches for more cost-effective detector alternatives become unavoidable. As an alternative to these type of detectors, studies have been initiated on chalcogen doped silicon photodetectors due to low-cost raw material and production costs. In later studies, micro-structured detectors have been obtained by melting the surface of silicon-based materials doped with over high sulphur locally and rapidly. In addition, efficiency increase of silicon-based solar cells by reduction of their costs has rapidly enhanced usability of silicon in energy sector as well. Initially, idea of roughening the surface of silicon by doping it above normal was suggested in order to enhance the performance of solar cells. Therefore, it was thought that near infrared rays can be also absorbed in addition to visible region and solar rays can be utilized more efficiently owing to the abundance of intermediate energy levels. Idea of using black silicon material over infrared imaging has emerged upon obtaining photoreaction in infrared band together with the over dopings performed.

Upon discovery of high optoelectronic features of black silicon by 2000s, ultra rapid melting process was applied on the surface of over doped silicon samples by nanosecond and femtosecond pulsed laser synchronously and the surface optical absorption was enabled to increase over 90% in visible and near infrared region by creating needle-like microstructures on the surface. In addition, it was revealed that these microstructures on the surface affect the absorption depending on height. Then, it was accomplished to create sulfur, selenium and tellurium layered microstructure (microcrystalline) on the surface by using chalcogen ions in order to dope it with donor ions providing two electrons. Also, it was shown that this material has significant optoelectronic features such as high absorption and reactiveness.

High absorptance and efficiency were achieved from the produced samples in near infrared wavelengths. A photodetector which can perform detection in near infrared region was developed in accordance with these results obtained. Afterwards, black silicon photodetectors have been put on the market commercially.

In the recent times, production technologies of silicon devices (infrared semiconductor photodiodes, light emitting diodes and thin film solar cells) are developed based on low cost and high performance. In some studies carried out, silicon materials were doped with chalcogen elements by using methods such as ion implantation, diffusion, etc. and these micro-structured silicon materials obtained were processed with femtosecond laser and their optoelectronic features were examined.

When the previous studies on the subject were examined, it was seen that parameters of femto or pico second-laser parameters used in production of silicon-based infrared photodetector materials and sample thickness could not been exhibited evidently.

The fact that there is not any optical (absorptance) study on 2500 nm wavelength and any electro-optical study on 1250 nm wavelength stands out as a significant deficiency at present. It is required to exhibit absorptance spectrum behaviour over this value and to detect whether these photodetectors will function in longer wavelengths and also to detect the reaction to be given by the doping concentrations in the photodetectors at high concentrations and to reach electro-optical measurements of the photodetectors over approximately 1250 nm wavelength as well.

The Chinese patent document no. CN105655419, an application in the state of the art, discloses a black silicon material doped with chalcogen elements functioning in a wide wavelength range.

The United States patent document no. US2012012967, another application in the state of the art, discloses a method of manufacture for black silicon based metal-semiconductor photodetectors.

SUMMARY

An objective of the present invention is to realize a chalcogen doped black silicon (Si) based semiconductor photodiode (photodetector) which functions in a wide band range up to medium wave infrared and far wavelengths in addition to visible region and near infrared, and obtaining method thereof.

Another objective of the present invention is to realize a semiconductor photodiode (photodetector) which is chalcogen doped to black silicon samples, and obtaining method thereof.

BRIEF DESCRIPTION OF THE DRAWINGS

"A Semiconductor Photodiode Functioning in a Wide Band Range and Obtaining Method Thereof" realized to fulfil the objectives of the present invention is shown in the figures attached, in which.

Figure 1:
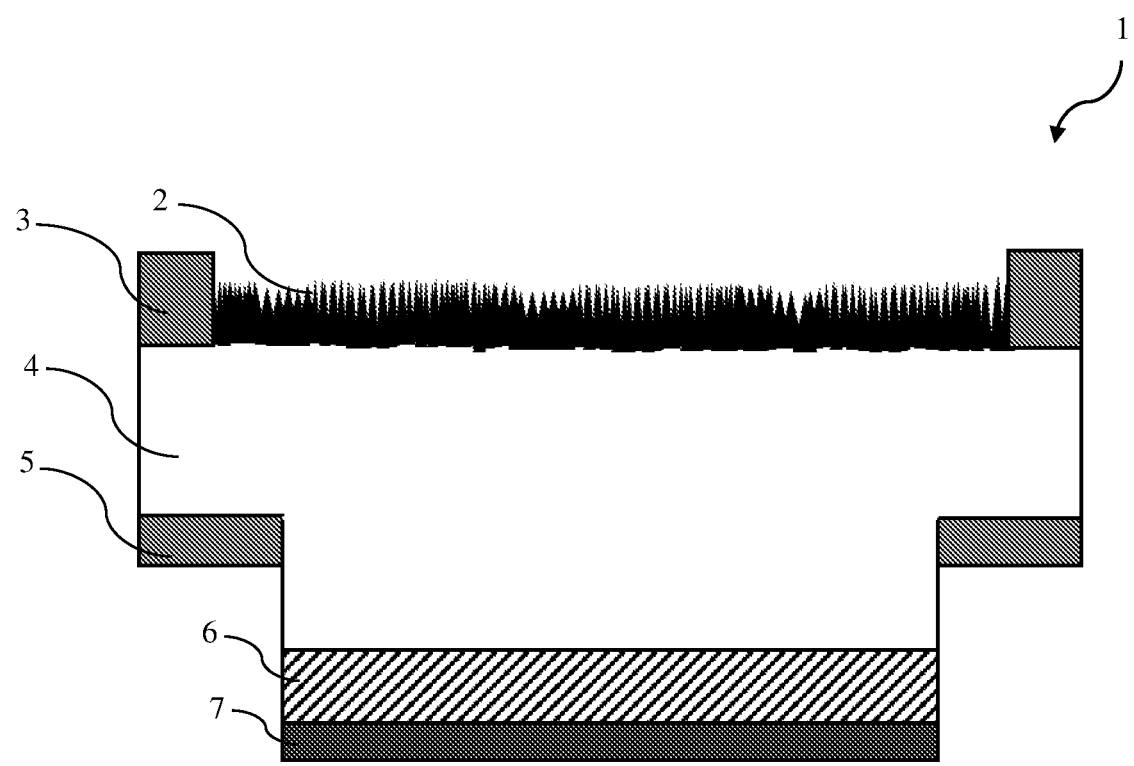
FIG. 1 is a side view of the inventive semiconductor photodiode.
Figure 2:
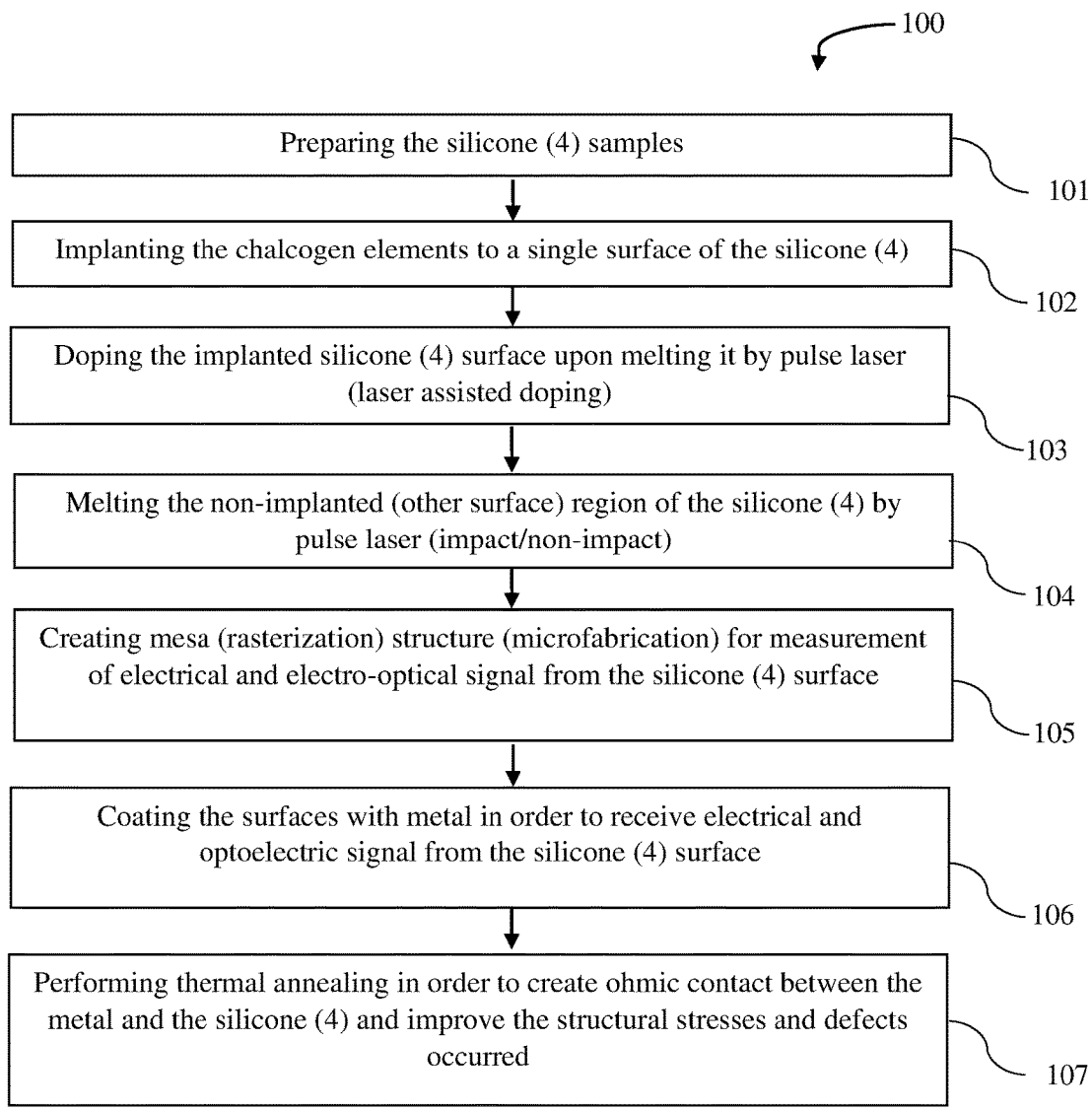
FIG. 2 is a flowchart related to the inventive semiconductor photodiode obtaining method.

The components illustrated in the figures are individually numbered, where the numbers refer to the following:

1. Semiconductor photodiode
2. Light absorber region
3. First electrical lower contact
4. Silicon
5. Second electrical lower contact
6. Chalcogen doped hyper-filled silicon region
7. Upper electrical contact

DETAILED DESCRIPTION OF THE EMBODIMENTS

The inventive semiconductor photodiode (1) functioning in a wide band range comprises:

a light absorber region (2) in micro structure which can provide light absorbance upon being roughened by laser;

a first electrical lower contact (3) which is coated with metal materials such as aluminium (Al), silver (Ag);

a silicon (4) which consists of crystalline silicon (c-Si);

a second electrical lower contact (5) which is coated with metal materials such as aluminium (Al), silver (Ag);

a chalcogen doped hyper-filled silicon region (6) which is obtained as a result of doping by pulse laser to the silicon (4) region implanted by chalcogen elements; and upper electrical contact (7) parts which are coated generally in the thickness range of 10 nm-1000 nm by using two-layered alloys with aluminium (Al)-silver (Ag), two-layered alloys with titanium (Ti)-gold (Au), three-layered alloys with Ti-Platinum(Pt)—Au—Ag or three-layered alloys with Ti-lead(Pb)—Ag.

In a preferred embodiment of the invention, the first electrical lower contact (3) is made of a metal creating ohmic contact.

In a preferred embodiment of the invention, the second electrical lower contact (5) is made of a metal creating ohmic contact.

In a preferred embodiment of the invention, the upper electrical contact (7) is made of a metal creating ohmic contact.

In a preferred embodiment of the invention, the semiconductor photodiode (1) functioning in a wide band range can function in a wide band range up to medium and long infrared wavelengths in addition to visible region and near infrared.

In a preferred embodiment of the invention, the semiconductor photodiode (1) functioning in a wide band (of electromagnetic spectrum) range enables to keep incoming low-energy photons and to show high reaction.

In a preferred embodiment of the invention, by means of the semiconductor photodiode (1) functioning in a wide band range; preferred semiconductor photodiodes have the chance to function in a wider wavelength in army, law-enforcement forces, defense industry (night view), various health, industrial fields (electric field, heat insulation, etc.), information technology and energy sector (photovoltaic).

The inventive semiconductor photodiode (1) obtaining method (100) comprises steps of:

preparing the silicon (4) samples (101);

implanting the chalcogen elements to a single surface of the silicon (4) (102);

doping the implanted silicon (4) surface upon melting it by pulse laser (laser assisted doping) (103);

melting the non-implanted (other surface) region of the silicon (4) by pulse laser (pulsed/non-pulsed) (104);

creating mesa (rasterization) structure (microfabrication) for measurement of electrical and electro-optical signal from the silicon (4) surface (105);

coating the surfaces with metal in order to receive electrical and optoelectric signal from the silicon (4) surface (106); and performing thermal annealing in order to create ohmic contact between the metal and the silicon (4) and improve the structural stresses and defects occurred (107).

In a preferred embodiment of the invention, semiconductor "p-type/n-type Si(100), Si(111) or Si(110)" crystals having resistivity value of 1-10 Ω·cm are used while preparing the silicon (4) samples (101).

In a preferred embodiment of the invention, S, Se and Te elements—that are chalcogen elements— are passively implanted to any surface of the silicon for the transaction of implanting the chalcogen elements to a single surface of the silicon (4) (102) (the implant parameters are shown in the Table 1). Here, the silicon (4) surface is doped by using laser assisted doping technique with the chalcogen elements.

TABLE 1

| Implant parameters | | | |
|---|---|---|---|
| Elements | Doping Energy | Doping Doses | Sample (Silicon) |
| Sulfur (S) | 90-250 keV | $10^{16-17}$ ion/cm$^2$ | p-type/n-type |
| Selenium (Se) | 150-500 keV | $10^{14-16}$ ion/cm$^2$ | Si (100), Si (111), |
| Tellurium (Te) | 150-500 keV | $10^{14-16}$ ion/cm$^2$ | Si (110), |
| | | | Mono-crystalline |
| | | | material production: |
| | | | Czochralski method |
| | | | (CZ) and Float Zone |
| | | | method (FZ) FZ |

In a preferred embodiment of the invention, a small number of laser pulses are performed on the silicon (4) surface that is implanted with the chalcogen elements— in the transaction of doping the implanted silicon (4) surface upon melting it by pulse laser (laser assisted doping) (103) (the related laser pulse parameters are shown in the Table 2). It is required to carry out transaction at suitable values of parameters such as laser power, number of laser radiation pulse, pulse frequency, pulse duration, scanning speed and wavelength while melting the layer wherein the chalcogen elements are located in the chalcogen doped silicon (4) material by laser. Not working at optimum values included in the Table 2 causes the layer, wherein the chalcogen elements are located, to disappear by being be melted excessively (ablation) or causes the silicon (4) atoms and the chalcogen elements not to be able to associate adequately in consequence of not being able to melt the said layer adequately. Thereby, over doping the implanted surface side of the silicon (4) (the chalcogen elements that are located at nanometer depth) is realized. The reason of performing a small number of laser pulses is to prevent reduction of the concentration of the implanted chalcogen elements through evaporation and to realize over doping. Thus, the silicon (4) enhances reactiveness at longer wavelengths by creating a wider intermediate energy band. In addition, it exhibits advantage for making microfabrication (rasterization).

TABLE 2

Laser pulse parameters for the implanted silicone surface

| Laser mode, Repetition Frequency | Laser Energy | Laser Scanning Speed | Number of Laser Pulse/ Scanning | Sample |
|---|---|---|---|---|
| Brust (impact) mode, continuous mode ≤50 kHz | 0.5-1.7 J/cm² | 5-10 mm/s | 1-5 | p-type/n-type Si (100), Si (111), Si (110), Mono-crystalline material production: Czochralski method (CZ) and Float Zone method (FZ) |

In a preferred embodiment of the invention, the silicon (4) crystals are placed to a table at first for the transaction of melting the non-implanted (other surface) region of the silicon (4) by pulse laser (pulsed/non-pulsed) (104). This table whereon the silicon (4) crystals are located are taken to a vacuum chamber and the environment is vacuumed. Or the transaction can also be carried out under gas (for example: air, inert gas or non-inert gases, etc.) atmospheres or in distilled water environment. After the environment suitable for the transaction is created; the surface is roughened (texturized) by melting/ablating the non-implanted (not comprising the chalcogen elements) surface of the silicon (4) through pulse laser, micro/nano structures (absorber layer) enabling absorption of light are obtained, and light absorbance is provided/enhanced in wide band wavelength by reducing the surface reflection of the silicon (4). In order not to reduce the implant concentration, transaction is carried out in this surface (the related laser pulse parameters are shown in the Table 3). Thereby, transaction can be carried out on doped and non-doped surfaces independently of each other in order to change/develop optical, electro-optical and energy band structure features of the silicon (4).

TABLE 3

Laser pulse parameters for the non-implanted silicone surface

| Laser mode, Repetition Frequency | Laser Energy | Laser Scanning Speed | Number of Laser Pulse/ Scanning | Sample |
|---|---|---|---|---|
| Brust (impact)/ continuous (non-impact) mode, ≤50 kHz | 0.5-3 J/cm² | 5-10 mm/s | ≤3000 | p-type/n-type Si (100), Si (111), Si (110), Mono-crystalline material production: Czochralski method (CZ) and Float Zone method (FZ) |

In a preferred embodiment of the invention, the transaction of creating mesa (rasterization) structure (microfabrication) for measurement of electrical and electro-optical signal from the silicon (4) surface (105) creates mesa structure for photodetectors by using classical/standard mesa etching technique or photolithography mesa abrasion (rasterization) technique or photolithography mesa abrasion technique (FIG. 1). Use of laser abrasion method is another technique for creating mesa structure. Mesa structure is created by abrasing the requested points at requested depths by laser, on the chalcogen doped silicon (4) surface with optimum parameters. Silicon oxide occurs on the surface during abrasion however mesa is obtained by removing the oxidized layer from the surface by applying HF (hydrogenfluoride).

In a preferred embodiment of the invention, classical/standard metal coating (metalization) techniques are used in the transaction of coating the surfaces with metal in order to receive electrical and optoelectric signal from the silicon (4) surface (106). Thus, the first electrical lower contact (3), the second electrical lower contact (5) and the upper electrical contact (7) are obtained. The semiconductor photodiode structure indicating the metal layers obtained after the metal coating transactions are carried out are also shown in the FIG. 1.

In another embodiment of the invention, in the transaction of coating the surfaces with metal in order to receive electrical and optoelectric signal from the silicon (4) surface (106), the non-implanted side of the silicon (4) is seated on the glass surface that is coated with metal thin film and certain points of the abrasion silicon (4) surfaces are coated with metal upon being evaporating by the pulses made by the pulse laser in vacuum environment. Thereby, the first electrical lower contact (3), the second electrical lower contact (5) and the upper electrical contact (7) are obtained. (The semiconductor photodiode structure indicating the metal layers obtained after the metal coating transactions are carried out are also shown in the FIG. 1.).

In a preferred embodiment of the invention, the transaction of performing thermal annealing in order to create ohmic contact between the metal and the silicon (4) and improve the structural stresses and defects occurred (107) is carried out between temperature values of 350K-900K and time interval of 5 min-60 min.

Within these basic concepts; it is possible to develop various embodiments of the inventive semiconductor photodiode functioning in a wide band range (1) and obtaining method thereof (100); the invention cannot be limited to examples disclosed herein and it is essentially according to claims.

The invention claimed is:
1. A semiconductor photodiode obtaining method, comprising:
   preparing silicon samples;
   implanting chalcogen elements to a single surface of surfaces of a silicon to obtain an implanted silicon surface;
   doping the implanted silicon surface upon melting the implanted silicon surface by a pulse laser to complete laser assisted doping;
   melting a non-implanted region of the silicon by the pulse laser in a pulsed mode and a continuous mode;
   creating a mesa structure for a measurement of an electrical signal and an electro-optical signal from the implanted silicon surface;
   coating the surfaces of the silicon with a metal to receive the electrical signal and an optoelectric signal from the implanted silicon surface; and
   performing thermal annealing to create an ohmic contact between the metal and the silicon and improve structural stresses and defects occurred,
   wherein in the step of creating the mesa structure for the measurement of the electrical signal and the electro-optical signal from the implanted silicon surface, a silicon oxide occurring on the implanted silicon surface during an abrasion is removed from the implanted silicon surface by applying hydrogenfluoride, and a mesa is obtained.
2. The semiconductor photodiode obtaining method according to claim 1, wherein the step of preparing the silicon samples is implemented by using semiconductor p-type/n-type Si, Si or Si crystals having a resistivity value of 1-10 Ω·cm.

3. The semiconductor photodiode obtaining method according to claim 1, wherein the step of implanting the chalcogen elements to the single surface of the silicon is implemented by implanting S, Se and Te elements, wherein the S, Se and Te elements are the chalcogen elements and are passively implanted to the surfaces of the silicon.

4. The semiconductor photodiode obtaining method according to claim 1, wherein the step of implanting the chalcogen elements to the single surface of the silicon is implemented by doping the implanted silicon surface by using a laser assisted doping technique with the chalcogen elements.

5. The semiconductor photodiode obtaining method according to claim 1, wherein the step of doping the implanted silicon surface upon melting the implanted silicon surface by the pulse laser to complete the laser assisted doping is implemented by making a number of laser pulses on the implanted silicon surface implanted with the chalcogen elements.

6. The semiconductor photodiode obtaining method according to claim 1, wherein in the step of doping the implanted silicon surface upon melting the implanted silicon surface by the pulse laser to complete the laser assisted doping, a transaction is a carried out at predetermined values of parameters comprising a laser power, a number of laser radiation pulse, a pulse frequency, a pulse duration, a scanning speed and a wavelength while melting a layer, wherein
the chalcogen elements are located in a chalcogen doped silicon material by the pulse laser.

7. The semiconductor photodiode obtaining method according to claim 1, wherein the step of doping the implanted silicon surface upon melting the implanted silicon surface by the pulse laser to complete the laser assisted doping enables to avoid disappearance or ablation of a layer, wherein
the chalcogen elements are located, by working at optimum values or preventing the silicon atoms and the chalcogen elements from associating adequately in consequence of not melting a layer adequately.

8. The semiconductor photodiode obtaining method according to claim 1, wherein the step of doping the implanted silicon surface upon melting the implanted silicon surface by the pulse laser to complete the laser assisted doping implements over doping of an implanted surface side of the silicon by working at optimum values, wherein the implanted surface side is the chalcogen elements located at a nanometer depth.

9. The semiconductor photodiode obtaining method according to claim 1, wherein the step of doping the implanted silicon surface upon melting the implanted silicon surface by the pulse laser to complete the laser assisted doping prevents a reduction of a concentration of implanted chalcogen elements through evaporation and implements over doping by performing a number of laser pulses.

10. The semiconductor photodiode obtaining method according to claim 1, wherein the step of doping the implanted silicon surface upon melting the implanted silicon surface by the pulse laser to complete the laser assisted doping enables the silicon to exhibit reactiveness at longer wavelengths by creating a wider intermediate energy band.

11. The semiconductor photodiode obtaining method according to claim 1, wherein the step of melting the non-implanted region of the silicon by the pulse laser in the pulsed mode and the continuous mode includes:
carrying out transactions of surface roughening or texturizing a non-implanted surface of the silicon located on a table by melting/ablating through the pulse laser under a vacuum in a vacuum chamber, a gas atmosphere comprising an air, an inert gas or non-inert gases or in a distilled water environment;
obtaining a micro/nano structures enabling absorption of light, wherein the micro/nano structures are an absorber layer; and
creating an absorption of light in a wide band wavelength by reducing a surface reflection of the silicon.

12. The semiconductor photodiode obtaining method according to claim 1, wherein the step of melting the non-implanted region of the silicon by pulse laser in the pulsed mode and the continuous mode processes doped and non-doped surfaces independently of each other in order to change/develop optical, electro-optical and energy band structure features of the silicon by carrying out transactions on a non-implanted surface in order not to reduce an implant concentration.

13. The semiconductor photodiode obtaining method according to claim 1, wherein the step of creating the mesa structure for the measurement of the electrical signal and the electro-optical signal from the implanted silicon surface creates the mesa structure by abrasing requested points at requested depths by laser, on a chalcogen doped silicon surface with optimum parameters.

14. The semiconductor photodiode obtaining method according to claim 1, wherein the step of coating the surfaces with the metal to receive the electrical signal and the optoelectric signal from the implanted silicon surface obtains a first electrical lower contact, a second electrical lower contact and upper electrical contact parts by classical/standard metal coating or metalization techniques.

15. The semiconductor photodiode obtaining method according to claim 1, wherein the step of performing the thermal annealing to create the ohmic contact between the metal and the silicon and improve the structural stresses and defects occurred is carried out between temperature values of 350 K-900 K and a time interval of 5 min-60 min.

16. A semiconductor photodiode obtaining method, comprising:
preparing silicon samples;
implanting chalcogen elements to a single surface of surfaces of a silicon to obtain an implanted silicon surface;
doping the implanted silicon surface upon melting the implanted silicon surface by a pulse laser to complete laser assisted doping;
melting a non-implanted region of the silicon by the pulse laser in a pulsed mode and a continuous mode;
creating a mesa structure for a measurement of an electrical signal and an electro-optical signal from the implanted silicon surface;
coating the surfaces of the silicon with a metal to receive the electrical signal and an optoelectric signal from the implanted silicon surface; and
performing thermal annealing to create an ohmic contact between the metal and the silicon and improve structural stresses and defects occurred,
wherein in the step of coating the surfaces with the metal to receive the electrical signal and the optoelectric signal from the implanted silicon surface, a first electrical lower contact, a second electrical lower contact and upper electrical contact parts are obtained when a non-implanted side of the silicon is seated on a glass surface coated with a metal film and points of abrasion silicon surfaces are coated with a metal upon being evaporating by pulses made by the pulse laser in a vacuum environment.

\* \* \* \* \*